(12) United States Patent
Mis et al.

(10) Patent No.: US 7,839,000 B2
(45) Date of Patent: Nov. 23, 2010

(54) SOLDER STRUCTURES INCLUDING BARRIER LAYERS WITH NICKEL AND/OR COPPER

(75) Inventors: J. Daniel Mis, Cary, NC (US); Gretchen Adema, Raleigh, NC (US); Susan Bumgarner, Clearwater, FL (US); Pooja Chilukuri, Morrisville, NC (US); Christine Rinne, Apex, NC (US); Glenn Rinne, Apex, NC (US)

(73) Assignee: Unitive International Limited, Curacao (AN)

( * ) Notice: Subject to any disclaimer, the term of this patent is extended or adjusted under 35 U.S.C. 154(b) by 0 days.

(21) Appl. No.: 12/437,632

(22) Filed: May 8, 2009

(65) Prior Publication Data
US 2009/0212427 A1 Aug. 27, 2009

Related U.S. Application Data

(63) Continuation of application No. 11/170,220, filed on Jun. 29, 2005, now Pat. No. 7,547,623, and a continuation-in-part of application No. 10/601,938, filed on Jun. 23, 2003, now Pat. No. 6,960,828.

(60) Provisional application No. 60/584,016, filed on Jun. 30, 2004, provisional application No. 60/391,511, filed on Jun. 25, 2002.

(51) Int. Cl.
 *H01L 23/48* (2006.01)
(52) U.S. Cl. .................................. 257/781; 257/779
(58) Field of Classification Search ............... 257/779, 257/781
See application file for complete search history.

(56) References Cited

U.S. PATENT DOCUMENTS

| | | | |
|---|---|---|---|
| 162,257 A | 4/1875 | Yung | |
| 3,105,869 A | 10/1963 | Branch et al. | |
| 3,244,947 A | 4/1966 | Slater | |
| 3,259,814 A | 7/1966 | Green | |
| 3,274,458 A | 9/1966 | Boyer et al. | |

(Continued)

FOREIGN PATENT DOCUMENTS

CN 1269607 1/2002

(Continued)

OTHER PUBLICATIONS

Adema et al., *Flip Chip Technology: A Method for Providing Known Good Die with High Density Interconnections*, MCM '94 Proceedings, pp. 41-49.

(Continued)

*Primary Examiner*—Douglas M Menz
(74) *Attorney, Agent, or Firm*—Myers Bigel Sibley & Sajovec, P.A.

(57) ABSTRACT

An electronic device may include an electronic substrate, and an under bump seed metallurgy layer on the electronic substrate. A barrier layer may be provided on the under bump seed metallurgy layer so that the under bump seed metallurgy layer is between the barrier layer and the electronic substrate, and the barrier layer may include nickel and/or copper. Moreover, portions of the under bump seed metallurgy layer may be undercut relative to portions of the barrier layer. In addition, a solder layer may be provided on the barrier layer so that the barrier layer is between the solder layer and the under bump seed metallurgy layer.

18 Claims, 2 Drawing Sheets

U.S. PATENT DOCUMENTS

| | | |
|---|---|---|
| 3,316,465 A | 4/1967 | von Bermuth et al. |
| 3,392,442 A | 7/1968 | Napier et al. |
| 3,458,925 A | 8/1969 | Napier et al. |
| 3,461,357 A | 8/1969 | Mutter et al. |
| 3,489,965 A | 1/1970 | Helsdon |
| 3,501,681 A | 3/1970 | Weir |
| 3,625,837 A | 12/1971 | Nelson et al. |
| 3,663,184 A | 5/1972 | Wood et al. |
| 3,760,238 A | 9/1973 | Hamer et al. |
| 3,770,874 A | 11/1973 | Krieger et al. |
| 3,839,727 A | 10/1974 | Herdzik et al. |
| 3,871,014 A | 3/1975 | King et al. |
| 3,871,015 A | 3/1975 | Lin et al. |
| 3,897,871 A | 8/1975 | Zimbauer |
| 3,916,080 A | 10/1975 | Wakamatsu |
| 3,942,187 A | 3/1976 | Gelsing et al. |
| 3,959,577 A | 5/1976 | Frink |
| 3,986,255 A | 10/1976 | Mandal |
| 3,993,123 A | 11/1976 | Chu et al. |
| 4,035,526 A | 7/1977 | Konantz et al. |
| 4,074,342 A | 2/1978 | Honn et al. |
| 4,113,578 A | 9/1978 | Del Monte |
| 4,113,587 A | 9/1978 | Chikamori |
| 4,168,480 A | 9/1979 | De Lucia |
| 4,244,002 A | 1/1981 | Sato et al. |
| 4,257,905 A | 3/1981 | Christophorou et al. |
| 4,266,282 A | 5/1981 | Henle et al. |
| 4,273,859 A | 6/1981 | Mones et al. |
| 4,382,517 A | 5/1983 | Welsch |
| 4,449,580 A | 5/1984 | Reisman et al. |
| 4,473,263 A | 9/1984 | Sunstein |
| 4,505,029 A | 3/1985 | Owyang et al. |
| 4,511,873 A | 4/1985 | Baier et al. |
| 4,532,576 A | 7/1985 | Reimer |
| 4,545,610 A | 10/1985 | Lakritz et al. |
| 4,563,697 A | 1/1986 | Miura |
| 4,565,901 A | 1/1986 | Hirooka et al. |
| 4,657,146 A | 4/1987 | Walters |
| 4,661,375 A | 4/1987 | Thomas |
| 4,673,772 A | 6/1987 | Satoh et al. |
| 4,733,813 A | 3/1988 | Le Meau et al. |
| 4,752,027 A | 6/1988 | Oschwend |
| 4,756,467 A | 7/1988 | Schatzberg |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,855,809 A | 8/1989 | Malhi et al. |
| 4,878,611 A | 11/1989 | LoVasco et al. |
| 4,893,403 A | 1/1990 | Heflinger et al. |
| 4,897,508 A | 1/1990 | Mahulikar et al. |
| 4,897,918 A | 2/1990 | Osaka et al. |
| 4,927,505 A | 5/1990 | Sharma et al. |
| 4,931,410 A | 6/1990 | Tokanaga et al. |
| 4,940,181 A | 7/1990 | Juskey, Jr. et al. |
| 4,948,754 A | 8/1990 | Kondo et al. |
| 4,950,623 A | 8/1990 | Dishon |
| 4,962,058 A | 10/1990 | Cronin et al. |
| 4,972,988 A | 11/1990 | Ohdate |
| 5,019,943 A | 5/1991 | Fassbender |
| 5,022,580 A | 6/1991 | Pedder |
| 5,024,372 A | 6/1991 | Altman et al. |
| 5,046,161 A | 9/1991 | Takada |
| 5,048,747 A | 9/1991 | Clark et al. |
| 5,113,314 A | 5/1992 | Wheeler et al. |
| 5,130,275 A | 7/1992 | Dion |
| 5,130,779 A | 7/1992 | Agarwala et al. |
| 5,135,155 A | 8/1992 | Kang et al. |
| 5,147,084 A | 9/1992 | Behun et al. |
| 5,152,451 A | 10/1992 | Derveaux et al. |
| 5,154,341 A | 10/1992 | Melton et al. |
| 5,160,409 A | 11/1992 | Moore et al. |
| 5,162,257 A | 11/1992 | Yung |
| 5,171,711 A | 12/1992 | Tobimatsu et al. |
| 5,194,137 A | 3/1993 | Moore et al. |
| 5,208,186 A | 5/1993 | Mathew |
| 5,211,807 A | 5/1993 | Yee |
| 5,216,280 A | 6/1993 | Tanaka et al. |
| 5,227,664 A | 7/1993 | Toshio |
| 5,234,149 A | 8/1993 | Katz et al. |
| 5,239,447 A | 8/1993 | Cotues et al. |
| 5,240,881 A | 8/1993 | Cayetano et al. |
| 5,250,843 A | 10/1993 | Eichelberger |
| 5,251,806 A | 10/1993 | Agarwala et al. |
| 5,252,781 A | 10/1993 | Shirai et al. |
| 5,268,072 A | 12/1993 | Agarwala et al. |
| 5,289,925 A | 3/1994 | Newmark |
| 5,293,006 A | 3/1994 | Yung |
| 5,325,265 A | 6/1994 | Turlik et al. |
| 5,327,013 A | 7/1994 | Moore et al. |
| 5,327,327 A | 7/1994 | Frew et al. |
| 5,329,068 A | 7/1994 | Hirata et al. |
| 5,335,795 A | 8/1994 | Chizen |
| 5,347,428 A | 9/1994 | Carson et al. |
| 5,354,711 A | 10/1994 | Heitzmann et al. |
| 5,381,946 A | 1/1995 | Koopman et al. |
| 5,391,514 A | 2/1995 | Gall et al. |
| 5,406,701 A | 4/1995 | Pepe et al. |
| 5,409,862 A | 4/1995 | Wada et al. |
| 5,418,186 A | 5/1995 | Park et al. |
| 5,424,920 A | 6/1995 | Miyake |
| 5,432,729 A | 7/1995 | Carson et al. |
| 5,453,582 A | 9/1995 | Amano et al. |
| 5,461,261 A | 10/1995 | Nishiguchi |
| 5,462,638 A | 10/1995 | Datta et al. |
| 5,470,787 A | 11/1995 | Greer |
| 5,471,092 A | 11/1995 | Chan et al. |
| 5,475,280 A | 12/1995 | Jones et al. |
| 5,492,235 A | 2/1996 | Crafts et al. |
| 5,503,286 A | 4/1996 | Nye, III et al. |
| 5,539,186 A | 7/1996 | Abrami et al. |
| 5,542,174 A | 8/1996 | Chiu |
| 5,547,740 A | 8/1996 | Higdon et al. |
| 5,551,627 A | 9/1996 | Leicht et al. |
| 5,553,769 A | 9/1996 | Ellerson et al. |
| 5,557,502 A | 9/1996 | Banerjee et al. |
| 5,609,287 A | 3/1997 | Izuta et al. |
| 5,616,962 A | 4/1997 | Ishikawa et al. |
| 5,627,396 A | 5/1997 | James et al. |
| 5,634,268 A | 6/1997 | Dalal et al. |
| 5,680,296 A | 10/1997 | Hileman et al. |
| 5,726,501 A | 3/1998 | Matsubara |
| 5,736,456 A | 4/1998 | Akram |
| 5,739,053 A | 4/1998 | Kawakita et al. |
| 5,744,382 A | 4/1998 | Kitayama et al. |
| 5,751,556 A | 5/1998 | Butler et al. |
| 5,759,437 A | 6/1998 | Datta et al. |
| 5,773,359 A | 6/1998 | Mitchell et al. |
| 5,789,271 A | 8/1998 | Akram |
| 5,793,116 A | 8/1998 | Rinne et al. |
| 5,796,168 A | 8/1998 | Datta et al. |
| 5,796,591 A | 8/1998 | Dalal et al. |
| 5,805,422 A | 9/1998 | Otake et al. |
| 5,812,378 A | 9/1998 | Fjelstad et al. |
| 5,851,911 A | 12/1998 | Farnworth |
| 5,859,470 A | 1/1999 | Ellerson et al. |
| 5,878,943 A | 3/1999 | Nishikawa et al. |
| 5,886,393 A | 3/1999 | Merrill et al. |
| 5,891,756 A | 4/1999 | Erickson et al. |
| 5,892,179 A | 4/1999 | Rinne et al. |
| 5,898,574 A | 4/1999 | Tan et al. |
| 5,902,686 A | 5/1999 | Mis |
| 5,906,312 A | 5/1999 | Zakel et al. |

| | | |
|---|---|---|
| 5,920,125 A | 7/1999 | Ellerson et al. |
| 5,923,539 A | 7/1999 | Matsui et al. |
| 5,928,404 A | 7/1999 | Paruchuri et al. |
| 5,937,320 A | 8/1999 | Andricacos et al. |
| 5,963,793 A | 10/1999 | Rinne et al. |
| 5,990,472 A | 11/1999 | Rinne |
| 6,013,572 A | 1/2000 | Hur |
| 6,015,505 A | 1/2000 | David et al. |
| 6,027,957 A | 2/2000 | Merritt et al. |
| 6,083,773 A | 7/2000 | Lake |
| 6,117,299 A | 9/2000 | Rinne et al. |
| 6,121,069 A | 9/2000 | Boyko et al. |
| 6,133,065 A | 10/2000 | Akram |
| 6,134,120 A | 10/2000 | Baldwin |
| 6,144,103 A | 11/2000 | Miller et al. |
| 6,162,652 A | 12/2000 | Dass et al. |
| 6,162,660 A | 12/2000 | LaFontaine, Jr. et al. |
| 6,162,718 A | 12/2000 | Boettcher |
| 6,169,325 B1 | 1/2001 | Azuma |
| 6,208,018 B1 | 3/2001 | Ma et al. |
| 6,221,682 B1 | 4/2001 | Danziger et al. |
| 6,222,279 B1 | 4/2001 | Mis et al. |
| 6,224,690 B1 | 5/2001 | Andricacos et al. |
| 6,231,743 B1 | 5/2001 | Etherington |
| 6,232,668 B1 | 5/2001 | Hikita et al. |
| 6,238,951 B1 | 5/2001 | Caillat |
| 6,251,501 B1 | 6/2001 | Higdon et al. |
| 6,281,106 B1 | 8/2001 | Higdon et al. |
| 6,320,262 B1 | 11/2001 | Murakami |
| 6,329,608 B1 | 12/2001 | Rinne et al. |
| 6,332,988 B1 | 12/2001 | Berger, Jr. et al. |
| 6,335,104 B1 | 1/2002 | Sambucetti et al. |
| 6,346,469 B1 | 2/2002 | Greer |
| 6,388,203 B1 | 5/2002 | Rinne et al. |
| 6,389,691 B1 | 5/2002 | Rinne et al. |
| 6,392,163 B1 | 5/2002 | Rinne et al. |
| 6,415,974 B2 | 7/2002 | Jao |
| 6,418,033 B1 | 7/2002 | Rinne |
| 6,419,974 B1 | 7/2002 | Silva et al. |
| 6,440,291 B1 | 8/2002 | Henri et al. |
| 6,441,487 B2 | 8/2002 | Elenius et al. |
| 6,452,270 B1 | 9/2002 | Huang |
| 6,452,271 B2 | 9/2002 | Jiang et al. |
| 6,468,893 B2 | 10/2002 | Ueoka et al. |
| 6,475,896 B1 | 11/2002 | Hashimoto |
| 6,476,494 B1 | 11/2002 | Hur et al. |
| 6,489,229 B1 | 12/2002 | Sheridan et al. |
| 6,492,197 B1 | 12/2002 | Rinne |
| 6,495,018 B1 | 12/2002 | Lowe |
| 6,521,996 B1 | 2/2003 | Seshan |
| 6,596,621 B1 | 7/2003 | Copeland et al. |
| 6,617,237 B1 | 9/2003 | Tong et al. |
| 6,617,655 B1 | 9/2003 | Estacio et al. |
| 6,620,722 B2 | 9/2003 | Kuo et al. |
| 6,622,907 B2 | 9/2003 | Fanti et al. |
| 6,642,079 B1 | 11/2003 | Liu et al. |
| 6,668,449 B2 | 12/2003 | Rumsey et al. |
| 6,673,711 B2 | 1/2004 | Tong et al. |
| 6,762,122 B2 | 7/2004 | Mis et al. |
| 6,784,086 B2 | 8/2004 | Ray et al. |
| 6,793,792 B2 | 9/2004 | Jones et al. |
| 6,805,974 B2 | 10/2004 | Choi et al. |
| 6,828,510 B1 | 12/2004 | Asai et al. |
| 6,835,643 B2 | 12/2004 | Akram |
| 6,853,076 B2 | 2/2005 | Datta et al. |
| 6,969,915 B2 | 11/2005 | Tago et al. |
| 6,977,213 B1 | 12/2005 | Tsai et al. |
| 7,119,000 B2 | 10/2006 | Shimizu et al. |
| 7,205,221 B2 | 4/2007 | Akram et al. |
| 2001/0011764 A1 | 8/2001 | Elenius et al. |
| 2001/0020745 A1 | 9/2001 | Jiang et al. |
| 2001/0042918 A1 | 11/2001 | Yanagida |
| 2002/0000665 A1 | 1/2002 | Barr et al. |
| 2002/0056742 A1 | 5/2002 | Rinne |
| 2002/0079576 A1 | 6/2002 | Seshan |
| 2002/0086520 A1 | 7/2002 | Chiang |
| 2002/0093098 A1 | 7/2002 | Barr et al. |
| 2002/0096764 A1 | 7/2002 | Huang |
| 2002/0197842 A1 | 12/2002 | Kuo et al. |
| 2003/0000738 A1 | 1/2003 | Rumsey et al. |
| 2003/0027379 A1 | 2/2003 | Liu |
| 2003/0060040 A1 | 3/2003 | Lee et al. |
| 2003/0107137 A1 | 6/2003 | Stierman et al. |
| 2003/0124833 A1 | 7/2003 | Tong et al. |
| 2003/0143830 A1 | 7/2003 | Akram |
| 2003/0186487 A1 | 10/2003 | Hogerl |
| 2003/0218246 A1 | 11/2003 | Abe et al. |
| 2004/0023450 A1 | 2/2004 | Katagiri et al. |
| 2004/0053483 A1 | 3/2004 | Nair et al. |
| 2004/0121267 A1 | 6/2004 | Jang |
| 2005/0012222 A1 | 1/2005 | Huang |
| 2007/0102815 A1 | 5/2007 | Kauffman et al. |

FOREIGN PATENT DOCUMENTS

| | | |
|---|---|---|
| DE | 42 05 029 C | 2/1993 |
| DE | 43 23 799 A1 | 1/1994 |
| DE | 0 782 191 A2 | 12/1996 |
| DE | 197 41 436 | 12/1998 |
| EP | 0 355 478 | 2/1990 |
| EP | 0 603 296 | 6/1994 |
| EP | 0 609 062 A1 | 8/1994 |
| EP | 0 736 972 A1 | 10/1996 |
| EP | 0 757 386 A2 | 2/1997 |
| EP | 0 782 191 A2 | 2/1997 |
| EP | 0 907 207 | 4/1999 |
| EP | 1 146 552 | 10/2001 |
| EP | 1 148 548 | 10/2001 |
| FR | 2 406 893 | 10/1978 |
| FR | 2 688 628 | 9/1993 |
| FR | 2 705 832 | 12/1994 |
| GB | 1288564 | 9/1972 |
| GB | 2062 963 | 5/1981 |
| GB | 2 194 387 | 3/1988 |
| JP | 54050269 | 4/1979 |
| JP | 54-128669 | 10/1979 |
| JP | 55-111127 | 8/1980 |
| JP | 57-73952 | 5/1982 |
| JP | 57-197838 | 12/1982 |
| JP | 59-154041 | 9/1984 |
| JP | 6-116552 | 1/1986 |
| JP | 63099558 | 4/1988 |
| JP | 63-222445 | 9/1988 |
| JP | 01094696 | 4/1989 |
| JP | 04-133330 | 5/1992 |
| JP | 4-150033 | 5/1992 |
| JP | 07066207 | 1/1994 |
| JP | 07-226400 | 8/1995 |
| JP | 2000349111 | 12/2000 |
| JP | 2002203868 | 7/2002 |
| JP | 2003-342784 | 12/2003 |
| WO | WO 93/02831 | 2/1993 |
| WO | WO 93/22475 | 11/1993 |
| WO | WO 96/30933 | 10/1996 |
| WO | WO 96/31905 | 10/1996 |
| WO | WO 97/03465 | 1/1997 |
| WO | WO 97/45871 | 12/1997 |
| WO | WO 98/06118 | 2/1998 |
| WO | WO 02/03461 | 1/2002 |

OTHER PUBLICATIONS

Akira at al. "TI Concentration Effect on Adhesive Energy at Cu/TiW Interface" *Journal of Applied Physics* 84(9): 4941-4944 (1998).

Arai et al. "Sn-Ag Solder Bump Formation for Flip-Chip Bonding by Electroplating" *Journal of the Electrochemical Society* 150(10): c730-c734 (2003).

Audet, et al; *Low Cost Bumping Process for Flip Chip*, Proc. 1995 International Flip Chip, BGA, and Ado Pkg. Symposium ITAP 95, '95 Flip Chip, BGA, TAB & AP Symposium, pp. 16-21 (1995).

Chan "Investigation of Cr/Cu/Cu/Ni Under Bump Metallization for Lead-free Applications" *2002 Electronics Packaging Technology Conference* 270-275 (2002).

Choi et al; *Electromigration of Flip Chip Solder Bump on Cu/Ni(V) A1 Thin Film Under Bump Metallization*; 2002 Electronic Components and Technology Conference; pp. 1201-1205.

Danzl et al. "The Use of Concentrated Hydrogen Peroxide for the Removal of a TiW ARC from Aluminum Bond Pads" *IEEE/CPMT International Electronics Manufacturing Technology Symposium* pp. 99-107 (1997).

Datta, et al., *Electrochemical Fabrication of Mechanically Robust PbSn C4 Interconnections*, J. Electrochem. Soc., vol. 142, No. 11, pp. 3779-3785 (Nov. 1995).

Drake et al; *An Electrostatically Actuated Micro-Relay*, Transducers '95, Eurosensors IX, The 8th International Conference on Solid-State Sensors and Actuators, and Eurosensors IX, pp. 380-383.

Edelstein, D.C., et al; Derwent Publications Ltd. London, GB: AN 2002-308284 XP-002243726.

Ezawa et al. "Eutectic Sn-Ag Solder Bump Process for ULSI Flip Chip Technology" *IEEE Transactions on Electronics Packaging Manufacturing* 24(4): 275-281 (2001).

Ezawa et al; *Pb-Free Bumping by Alloying Electroplated Metal Stacks*; 2003 Electronic Components and Technology Conference: pp. 664-667.

Graf "The Modern Dictionary of Electronics" Sixth Edition p. 386 (1984).

Greer "An Extended Eutectec Solder bump for FCOB" *1996 Electronic Componets and Technology Conference* pp. 546-551 (1996).

Guckel et al., *Electromagnetic Linear Actuators with Inductive Position Sensing for Micro Relay, Micro Value and Precision Positioning Applications*, Transducers '95, Eurosensors IX, The 8th International Conference on Solid-State Sensors and Actuators, and Eurosensors IX, pp. 324-327.

Hashimoto et al; *Thermally Controlled Magnetization Microrelay*, Transducers '95, Eurosensors IX, The 8th International Conference on Solid-State Sensors and Actuators, and Eurosensors IX, pp. 361-364.

Hawley et al. "Solutions to Catastrophic Yield Problems in MCM-D Interconnect Production" *1998 International Conference on Multichip Modules and High Density Packaging* pp. 118-123 (1998).

Hirsch, *Tin-Lead, Lead and Tin Plating*, Metal Finishing, Guidebook Directory 1987, 55th Guidebood-Directory Issue 1987, Mid Jan. 1987, vol. 85, No. 1A, ISSN 0026-0576, pp. 280-284.

Hosaka et al; Electromagnetic Microrelays: Concepts and Fundamental Characteristis, Sensors and Actuators A, 40 (1994), pp. 41-47

Howell et al: "Area Array Solder Interconnection Technology for the Three-Dimensional Silicon Cube", Proeedings of the 1995 45th Electronic Components & Technology Conference, pp. 1174-1178.

Inaba et al; *Solder Bump Formation Using Electroless Plating and Ultrasonic Soldering*, IEEE Transaction On Components, Hybrids, and Manufacturing Technology, vol. 13, No. 1, Mar. 1990, pp. 119-123.

International Search Report for International patent application No. PCT/US2004/005818 mailed on Sep. 28, 2004.

International Search Report and Written Opinion of the International Searching Authority for International patent application No. PCT/US2005/023041 mailed on Oct. 11, 2005.

International Search Report and Written Opinion of the International Searching Authority for International Application No. PCT/US2005/012029 mailed on Oct. 28, 2005.

International Search Report dated Dec. 9, 1992 of International Application. No. PCT/US 92/07722.

International Search Report for PCT/US 02/30697 mailed on Jun. 24, 2003.

International Search Report for PCT/US 03/20790 mailed on Jun. 2, 2004.

International Search Report for PCT/US2001/14674 mailed on Jan. 23, 2002.

International Search Report, PCT/US01/43948 Apr. 1, 2003.

International Search Report and Written Opinion (17 pages) corresponding to International Application No. PCT/US2005/040584; Mailing Date: May 24, 2006.

Invitation To Pay Additional Fees (5 pages) corresponding to International Application No. PCT/US2005/040584; Mailing Date: Apr. 4, 2006.

Invitation to Pay Additional Fees and Partial International Search Report for International patent application No. PCT/US2005/012029 mailed on Jul. 26, 2005.

Jung, et al., *The Influence of NiSn Intermetallics on the Performance of Flip Chip Contacts Using a Low Cost Electroless Nickel Bumping Approach*, IEPS Proceedings of the Technical Conference, 1996 Electronics Packaging Conference, Austin, Texas, pp. 14-25 (Sep. 29-Oct. 1, 1996).

Kang, et al; *Interfacial Reactions During Soldering With Lead-Tin Eutectic and Lead (Pb)-Free, Tin-Rich Solders, Journal of Electronic Materials*, vol. 25, No. 7, pp. 1113-1120 (1996).

Kim et al. "Electrodeposition of Near-Eutectic SnAg Solders for Wafer-Level Packaging" *Journal of The Electrochemical Society* 150(9): c577-c584 (2003).

Kiumi et al. "Processing, Properties, and reliability of electroplated Lead-Free Solder Bumps" *IEEE 2002 Inter Society Conference on Thermal Phenomena* pp. 909-914 (2002).

Knüppel, *Rugged Design for Reliable Switching: Micro a Relay Sets New Automotive Standards*, Components XXIX (1994), No. 4, pp. 30-32.

Lineback, "3D IC Packaging Moves Closer to Commercial Use", Electronic World News, May 21, 1990, p. 15.

Mis, et al; *Flip Chip Production Experience: Some Design, Process, Reliability, and Cost Considerations*, ISHM '96 Proceedings, Proc. 1996 International Symposium on Microelectronics SPIE vol. 2920, pp. 291-295 1996.

Multimedia Card Association, www.mmca.org.

PCB Assembly, *Electronic Packaging & Production*, vol. 35, No. 1, p. 40 (Jan. 1995).

SanDisk Corporation, SanDisk Flash Data Storage, San Disk Compact Flash™ and MultilMedia Card: Small Form Factor Solutions, 1999.

Solomon "Providing high Density and Performance for Chip-to Sytem Interconnection" *Advanced Packaging* (Nov. 2001) pp. 19-28

Specification Sheet, *NaiS, Ultra Low Profile 2 Amp-Polarized Relay*, TK-Relays.

Tessier et al; *Process Considerations in Fabricating Thin Film Multichip Modules*, Proceedings of the Technical Conference 1989 International Electronics Packaging Conference, 1989.

Yung et al. "Flip-Chip Process Utilizing Electroplated Solder Joints" *Proceedings of the Technical Conference* (Sep. 10-12, 1990) International Electronics Packaging Conference Malborough, Massachusetts pp. 1065-1073.

Yung et al; *Electroplated Solder Joints for Flip-Chip Applications*, Transactions on Components, Hybrids, and Manufacturing Technology, vol. 14 No. 3, Sep. 1991, pp. 549-559.

Zeng et al; *Six cases of reliability study of Pb-free solder joints in electronic packaging technology*, Reports: A Review Journal; Materials Science and Engineering R 38 (2002) pp. 55-105.

SOLDER STRUCTURES INCLUDING BARRIER LAYERS WITH NICKEL AND/OR COPPER

RELATED APPLICATION

The present application claims the benefit of priority as a Continuation application from U.S. application Ser. No. 11/170,220 filed on Jun. 29, 2005, now U.S. Pat. No. 7,547,623 which claims the benefit of priority as a Continuation-In-Part application from U.S. patent application Ser. No. 10/601,938 filed on Jun. 23, 2003, now U.S. Pat. No. 6,960,828 which claims the benefit of priority from U.S. Provisional Patent Application No. 60/391,511 filed on Jun. 25, 2002. U.S. application Ser. No. 11/170,220 also claims the benefit of priority from U.S. Provisional Application No. 60/584,016 filed on Jun. 30, 2004. The present application thus claims the benefit of priority from U.S. application Ser. No. 11/170,220, U.S. patent application Ser. No. 10/601,938, U.S. Provisional Patent Application No. 60/391,511, and U.S. Provisional Application No. 60/584,016. Moreover, the disclosures of all of the above referenced utility and provisional applications are hereby incorporated herein in their entirety by reference.

BACKGROUND

For relatively high pin-counts and/or relatively high performance SoCs (System-On-Chips), solder bumping on 300 mm-wafers is moving from a development phase to a high-volume production phase. At the same time, laws are being enacted to prohibit solders including lead (Pb). To meet the demand for mass-production using lead-free solder, eutectic tin-silver (Sn—Ag) solder alloys have been proposed. In addition, tin-silver-copper (Sn—Ag—Cu) ternary alloys have been proposed to potentially provide improved thermal fatigue properties.

In the reference by Hirokazu Ezawa et al. entitled *"Pb-Free Bumping By Alloying Electroplated Metal Stacks"* (IEEE, 2003 Electronic Components And Technology Conference, pages 664-667), a eutectic Sn—Ag solder bumping process is discussed using two step electroplating of Ag/Sn metal stacks. In the Ezawa reference, alloying behavior of Ag/Sn and Ag/Sn/Cu electroplated metal stacks is investigated using differential scanning calorimetry (DSC) analysis. In particular, a 2 µm Ag/50 µm Sn electroplated metal stack may provide the Sn—Ag solder alloy with a composition of Sn-3.5 wt. % Ag, with a melting temperature of 227° C., determined using a single peak of DSC analysis. For a 2 µm Ag/Cu/50 µm Sn electroplated stack, as the Cu thickness increases from 0 µm to 0.8 µm, the single peak temperature may decrease to 222° C. According to the Ezawa reference, metal stacks formed by multi-step electroplating can be successfully transformed to solder alloys by reflow annealing. The disclosure of the Esawa reference is hereby incorporated herein in its entirety by reference.

SUMMARY

According to some embodiments of the present invention, a method of forming an electronic device may include forming an under bump seed metallurgy layer on an electronic substrate. A nickel layer may be formed on the under bump seed metallurgy layer so that the under bump seed metallurgy layer is between the nickel layer and the electronic substrate, and portions of the under bump seed metallurgy layer may be free of the nickel layer. After forming the nickel layer, a lead free solder layer may be formed on the nickel layer so that the nickel layer is between the solder layer and the under bump seed metallurgy layer. In addition, a copper layer may be formed on the under bump seed metallurgy layer before forming the nickel layer so that the under bump seed metallurgy layer is between the copper layer and the electronic substrate, and so that the copper layer is between the nickel layer and the under bump seed metallurgy layer. In addition, portions of the under bump seed metallurgy layer may be free of the copper layer.

In addition, a plating mask may be formed on the under bump seed metallurgy layer before forming the copper layer, and portions of the under bump seed metallurgy layer may be exposed through the plating mask. Accordingly, the copper layer may be formed by plating the copper layer on the portions of the under bump seed metallurgy layer exposed through the plating mask, the nickel layer may be formed by plating the nickel layer on the copper layer, and the solder layer may be formed by plating the solder layer on the nickel layer. The plating mask may then be removed after forming the solder layer, and portions of the under bump seed metallurgy layer free of the copper and/or nickel layers may be removed after removing the plating mask.

The nickel layer may have a thickness in the range of about 1 µm (micrometer) to about 5 µm (micrometer), and more particularly, in the range of about 1.5 µm (micrometer) to about 5 µm (micrometer), and the copper layer may have a thickness greater than about 5 µm (micrometer). In addition, the solder layer may comprise a lead-free solder layer, for example, including tin and at least one of silver, bismuth, copper, indium, antimony, gold, and/or zinc, and a weight percent of tin in the solder may be greater than about 95 weight percent. More particularly, a weight percent of tin in the solder layer may be in the range of about 97 weight percent and about 99.5 weight percent.

Forming the solder layer may include forming a first layer of tin and forming a second layer of silver, bismuth, copper, indium, antimony, gold, and/or zinc, and the first layer may be between the second layer and the nickel layer. The first layer of tin may be greater than about 95 weight percent of the solder layer. More particularly, the first layer of tin may be in the range of about 97 weight percent and about 99.5 weight percent of the solder layer, and the first and second layers may be heated to provide an alloy thereof after forming the solder layer. More particularly, heating the first and second layers may include heating the first and second layers to a temperature that is less than a melting temperature of the first and/or second layers. In an alternative, heating the first and second layers may include heating the first and second layers to a temperature that is less than a melting temperature of one of the first or second layers and greater than a melting temperature of the other of the first or second layers. In another alternative, heating the first and second layers may include heating the first and second layers to a temperature that is less than a melting temperature of either of the first and second layers and above a melting temperature of the alloy thereof.

In addition, forming the under bump seed metallurgy layer may include forming an adhesion layer on the electronic substrate, and forming a conduction layer on the adhesion layer such that the adhesion layer is between the conduction layer and the electronic substrate. Moreover, the adhesion layer and the conduction layer may include different materials. The adhesion layer may include Ti (titanium), TiW (titanium-tungsten), TiN (titanium nitride), and/or Cr (chromium), and the conduction layer may include Cu (copper), Ag (silver), and/or Au (gold).

In an alternative, forming the solder layer may include plating first and second portions of the solder layer using a same plating bath including first and second plating metals. The first portion of the solder layer may be plated in the plating bath using a first plating voltage and/or current so that the first portion of the solder layer has a first concentration of the first plating metal. The second portion of the solder layer may be plated in the plating bath using a second plating voltage and/or current so that the second portion of the solder layer has a second concentration of the first plating metal different than the first concentration.

According to some additional embodiments of the present invention, a method of forming an electronic device may include forming an under bump seed metallurgy layer on an electronic substrate. A first solder layer including a first metal may be formed on portions of the under bump seed metallurgy layer so that the under bump seed metallurgy layer is between the first solder layer and the electronic substrate. A second solder layer including a second metal may be formed on the first solder layer so that the first solder layer is between the second solder layer and the under bump seed metallurgy layer. The first and second solder layers may then be heated to a temperature that is less than a melting temperature of the first and/or second metals to provide an alloy of the first and second metals.

The first metal may include one of silver or tin, and the second metal may include the other of silver or tin. More particularly, the first solder layer may be a layer of tin, and the second solder layer may be a layer of silver. Moreover, heating the first and second solder layers may include heating the first and second solder layers to a temperature that is less than a melting temperature of either of the first and second metals and that is greater than a melting temperature of the alloy of the first and second metals. Forming the first solder layer may include forming a layer of the first metal, and forming the second solder layer may include forming a layer of the second metal.

In an alternative, the first and second solder layers may be formed using a same plating bath including the first and second metals. Accordingly, forming the first solder layer may include plating the first solder layer using the plating bath and using a first plating voltage and/or plating current so that the first solder layer has a first concentration of the first metal. Similarly, forming the second solder layer may include plating the second solder layer using the plating bath and using a second plating voltage and/or plating current so that the second solder layer has a second concentration of the first metal different than the first concentration of the first metal.

In addition, a plating mask may be formed on the under bump seed metallurgy layer before forming the first and second solder layers, and portions of the under bump seed metallurgy layer may be exposed through the plating mask. Accordingly, forming the first solder layer may include plating the first solder layer on the portions of the under bump seed metallurgy layer exposed through the plating mask, and forming the second solder layer may include plating the second solder layer on the first solder layer. In addition, a copper layer may be plated on the portions of the tinder bump seed metallurgy layer exposed through the plating mask before forming the first and second solder layers. Moreover, a nickel layer may be formed on the copper layer before forming the first and second solder layers. Accordingly, the copper layer may be between the nickel layer and the under bump seed metallurgy layer, the nickel layer may be between the first solder layer and the copper layer, and the first solder layer may be between the second solder layer and the nickel layer.

Moreover, the alloy of the first and second metals may be lead free. For example, the first metal may include tin and the second metal may include silver, bismuth, copper, indium, antimony, gold, and/or zinc, and a weight percent of tin in the solder may be greater than about 95 weight percent. More particularly, a weight percent of tin in the alloy of the first and second metals may be in the range of about 97 weight percent to about 99.5 weight percent.

In addition, forming the under bump seed metallurgy layer may include forming an adhesion layer on the electronic substrate, and forming a conduction layer on the adhesion layer. The adhesion layer may be between the conduction layer and the electronic substrate, and the adhesion layer and the conduction layer may include different materials. More particularly, the adhesion layer may include Ti (titanium), TiW (titanium-tungsten), TiN (titanium nitride), and/or Cr (chromium), and the conduction layer may include Cu (copper), Ag (silver), and/or Au (gold).

According to some more embodiments of the present invention, a method of forming an electronic device may include forming an under bump seed metallurgy layer on an electronic substrate, and first and second solder layers may be plated using a same plating bath including first and second plating metals. More particularly, the first solder layer may be plated on portions of the under bump seed metallurgy layer using the plating bath and using a first plating voltage and/or plating current so that the first solder layer has a first concentration of the first plating metal. The second solder layer may be plated on the first solder layer using the plating bath and using a second plating voltage and/or plating current so that the second solder layer has a second concentration of the first plating metal different than the first concentration of the first plating metal.

After plating the first and second solder layers, the first and second solder layers may be heated to a temperature that is less than a melting temperature of the first and/or second metals to provide at least partial mixing of the first and second solder layers. For example, the first metal may be tin, and a weight percent of tin in the mixture of the first and second solder layers may be greater than about 95 weight percent. More particularly, a weight percent of tin in the mixture of the first and second solder layers may be in the range of about 97 weight percent to about 99.5 weight percent. Moreover, the first metal may include tin, and the second metal may include silver, bismuth, copper, indium, antimony, gold, and/or zinc.

The first solder layer may have a third concentration of the second metal, the second solder layer may have a fourth concentration of the second metal, and the third and fourth concentrations may be different. More particularly, the first concentration may be greater than the second concentration, and the fourth concentration may be greater than the third concentration.

In addition, a plating mask may be formed on the under bump seed metallurgy layer before plating the first and second solder layers such that portions of the tinder bump seed metallurgy layer are exposed through the plating mask. Accordingly, plating the first solder layer may include plating the first solder layer on portions of the under bump seed metallurgy layer exposed through the plating mask, plating the second solder layer may include plating the second solder layer on the first solder layer, and the first solder layer may be between the second solder layer and the under bump seed metallurgy layer. Before plating the first and second solder layers, a copper layer may be plated on portions of the under bump seed metallurgy layer exposed through the plating mask, and a nickel layer may be plated on the copper layer. Accordingly, the copper layer may be between the nickel layer and the under bump seed metallurgy layer, and the nickel layer may be between the first solder layer and the copper layer. In addition, the first and second solder layers may be lead free.

According to yet more embodiments of the present invention, an electronic device may include an electronic substrate and an under bump seed metallurgy layer on the electronic substrate. A nickel layer may be provided on the under bump seed metallurgy layer so that the under bump seed metallurgy layer is between the nickel layer and the electronic substrate, and portions of the under bump seed metallurgy layer may be free of the nickel layer. In addition, a lead free solder layer may be provided on the nickel layer so that the nickel layer is between the solder layer and the under bump seed metallurgy layer. In addition, a copper layer may be on the under bump seed metallurgy layer before forming the nickel layer so that the under bump seed metallurgy layer is between the copper layer and the electronic substrate, and so that the copper layer is between the nickel layer and the under bump seed metallurgy layer. Moreover, portions of the under bump seed metallurgy layer may be free of the copper layer.

The nickel layer may have a thickness in the range of about 1 μm (micrometer) to about 5 μm (micrometer), and more particularly, in the range of about 1.5 μm (micrometer) to about 5 μm (micrometer). The copper layer may have a thickness greater than about 5 μm (micrometer). Moreover, the solder layer may be a lead-free solder layer, for example, including tin and at least one of silver, bismuth, copper, indium, antimony, gold, and/or zinc, and a weight percent of tin in the solder may be greater than about 95 weight percent. A weight percent of tin in the solder layer may be in the range of about 97 weight percent and about 99.5 weight percent.

In an alternative, the solder layer may include a first layer of tin and a second layer of silver, bismuth, copper, indium, antimony, gold, and/or zinc, and the first layer of tin may be between the second layer and the nickel layer. The first layer of tin may be greater than about 95 weight percent of the solder layer. More particularly, the first layer of tin may be in the range of about 97 weight percent and about 99.5 weight percent of the solder layer.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Furthermore, relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes", and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

A potential difficulty faced by binary lead free structures is the ability to control the process in a manufacturing environment while allowing for a process window large enough for assembly. When plating a tin-silver solder, for example, tin may plate significantly more easily than silver due to differences in electrochemical potentials, and a desired concentration of tin in the resulting binary solder may be significantly greater than that of silver. A concentration of silver in the plating solution, however, may be much greater than that of tin in the plating solution to provide the desired concentrations in the plated solder. Because the concentration of tin in the plating solution is relatively low but the concentration of tin in the resulting plated solder is relatively high, the tin may be depleted from the solder relatively quickly, and a process control may be difficult to maintain.

According to embodiments of the present invention illustrated in FIGS. 1-4, an integrated circuit substrate 101 may include a semiconductor substrate having electronic circuits (such as one or more resistors, transistors, diodes, capacitors, inductors, etc.) therein, and a conductive input/output pad 103 (such as an aluminum and/or copper pad) on the substrate 101 may provide electrical connection with one or more circuits of the substrate 101. In addition, an insulating passivation layer 105 may be provided on the substrate 101 and input/output pad 103, and a via hole in the passivation layer 105 may expose at least portions of the input/output pad 103. As used herein, the term substrate may also be defined to include the input/output pad and the passivation layer. The term substrate may also include interconnection wiring therein.

Figure 1:
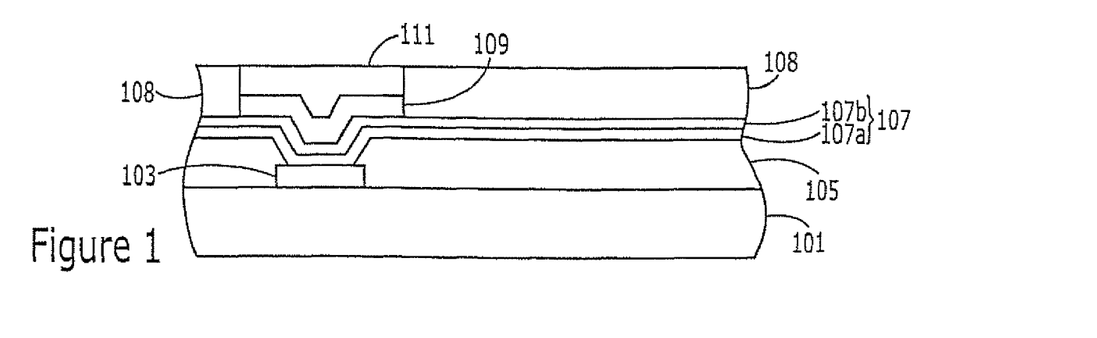
FIGS. 1-4 are cross-sectional views illustrating steps of forming solder bumps according to embodiments of the present invention.

As shown in FIG. 1, an under bump seed metallurgy layer 107 may be deposited on the passivation layer 105 and on exposed portions of the input/output pad 103, and the under bump seed metallurgy layer 107 may include an adhesion layer 107a, such as a layer including titanium (Ti), titanium-tungsten (TiW), titanium nitride (TiN), and/or chromium (Cr), and a conduction layer 107b, such as a layer including copper (Cu), silver (Ag), and/or gold (Au). A plating stencil 108 of an organic and/or an inorganic material can then be formed on the under bump seed metallurgy layer 107. The plating stencil 108, for example, may be formed by spinning or laminating a photosensitive material on the under bump seed metallurgy layer 107, baking the photosensitive material, selectively exposing the photosensitive material to light, and developing the photosensitive material to form a via hole exposing at least portions of the input/output pad 103.

An under bump barrier metallurgy layer 109 may then be plated on portions of the under bump seed metallurgy layer 107 exposed through the plating stencil 108, and the under bump barrier metallurgy layer 109 may include nickel (Ni) and/or copper (Cu). The under bump barrier metallurgy layer 109 may be a layer of nickel having a thickness in the range of about 1 μm (micrometers) to about 5 μm (micrometers), and more particularly, in the range of about 1.5 μm (micrometers) to about 5 μm (micrometers). Seed layers and nickel barrier layers are discussed, for example, in U.S. Patent Publication No. 2004005348' entitled "Methods Of Forming Electronic Structures Including Conductive Shunts Layers And Related Structures," the disclosure of which is hereby incorporated herein in its entirety by reference. In an alternative, the under bump barrier metallurgy layer 109 may be a layer of copper having a thickness greater than about 5 μm (micrometers). According to some embodiments of the present invention, the under bump barrier metallurgy layer 109 may include a copper layer (for example, having a thickness greater than about 5 μm) and a nickel layer (for example, having a thickness in the range of about 1 μm to about 5 μm) such that the copper layer is between the nickel layer and the under bump seed metallurgy layer 107. In some embodiments of the present invention, under bump barrier metallurgy layer 109 may include a nickel layer plated directly on the under bump seed metallurgy layer 107 without an intervening layer of plated copper.

After plating the under bump barrier metallurgy layer 109, a lead free solder bump 111 may be plated on the under bump barrier metallurgy layer 109, and the lead free solder bump 111 may be a binary lead free alloy solder bump such as a tin-silver (SnAg) alloy solder bump, a tin-silver-copper alloy solder bump, and/or a tin-copper alloy solder bump. Moreover, the lead free solder bump 111 may be plated as separate layers of tin and silver (or separate layers of tin, silver, and copper; separate layers of tin and copper; etc.), and a subsequent reflow (in some embodiments after removing the plating stencil) can be used to form the alloy thereof. In an alternative, the tin and silver may be plated together. In either case, the tin and silver may be provided such that a concentration of silver in the resulting solder alloy is sufficiently low to suppress formation of SnAg platelets, precipitates, and/or needles that may otherwise occur as a result of temperature excursions. A concentration of tin in the resulting solder alloy may be greater than about 95 weight percent. More particularly, a concentration of silver in the resulting solder alloy may be in the range of about 1 weight percent to about 3 weight percent, and/or a concentration of tin in the resulting solder alloy may be in the range of about 97 weight percent to about 99 weight percent. In other alternatives, the lead free solder bump 111 may include tin and at least one of bismuth, copper, indium, antimony, gold, zinc, and/or silver. For example, the lead-free solder bump 111 may include a tin-silver-copper solder. In another alternative, the lead free solder bump may include a tin-copper solder having a concentration of tin of about 99.5 weight percent.

For example, a first layer of tin can be plated followed by a second layer of silver, or a first layer of silver can be plated followed by a second layer of tin, and thicknesses of the layers of tin and silver can be determined to provide an average concentration of silver in the resulting SnAg solder alloy (after reflow) in the range of about 1 weight percent to about 3 weight percent, and/or to provide an average concentration of tin in the range of about 97 weight percent to about 99 weight percent. The thicker layer of tin may be plated before plating the thinner layer of silver, for example, because the thicker layer of tin may be easier to plate on the under bump barrier metallurgy layer 109 within the hole defined by the plating stencil 108. Stated in other words, the thinner layer of silver may be plated with better uniformity and/or control after plating the thicker tin layer. After plating the layers of the different metals (and in some embodiments after removing the plating stencil and/or after removing portions of the under bump seed metallurgy layer), the layers of tin and silver may be heated to a temperature that is less than a melting temperature of at least one of the metals to provide an alloy of the two metals (e.g., tin and silver). More particularly, the layers of the two metals may be heated to a temperature that is less than a melting temperature of either of the two metals (e.g., less than about 232 degrees C. for tin and less than about 962 degrees C. for silver), but that is greater than a melting temperature of the alloy of the two metals (e.g., greater than about 220 degrees C. for tin-silver). In another alternative, the layers of the two metals may be heated to a temperature that is greater than the melting temperature of one of the metals (e.g., greater than about 232 degrees C. for tin) but less than a melting temperature of the other metal (e.g. less than about 962 degrees C. for silver).

In an alternative for forming the solder layer 111, tin and silver can be plated together (simultaneously) to provide a plated alloy having an average concentration of silver in the range of about 1 weight percent to about 3 weight percent, and/or to provide an average concentration of tin in the range of about 97 weight percent to about 99 weight percent. A composition of the plated alloy may be controlled by adjusting an electroplating current density while plating the tin and silver using a plating solution including both tin and silver.

In another alternative for forming the solder layer 111, a first relatively tin rich layer may be plated, and then a second relatively silver rich layer may be plated using a same plating bath including both tin and silver. More particularly, the first relatively tin rich layer may be plated using the plating bath and using a first plating voltage and/or plating current, and the second relatively silver rich layer may be plated using the same plating bath and a second plating voltage and/or plating current (different than the first plating voltage and/or plating current) so that a concentration of tin in the first relatively tin rich layer is greater than a concentration of tin in the second relatively silver rich layer and so that a concentration of silver in the first relatively tin rich layer is less than a concentration of silver in the second relatively silver rich layer. For example, the first plating voltage and the first plating current may be less than the second plating voltage and the second plating current. At the higher plating voltage and higher plating current, the plating bath may be relatively depleted of tin in the vicinity of plating so that a plating rate of tin is reduced while plating the second relatively silver rich layer. As used herein, silver rich means that the concentration of silver is greater in the second layer than in the first layer, but does not necessarily mean that the concentration of silver in the second layer is greater than the concentration of tin in the second layer. After plating the first relatively tin rich layer and the second relatively silver rich layer (and in some embodiments after removing the plating stencil and/or after removing portions of the under bump seed metallurgy layer), the layers may be heated to provide at least partial mixing of the layers. More particularly, the layers may be heated to a temperature that is less than a melting temperature of at least one of silver and/or tin.

As shown in FIG. 1, portions of the under bump metallurgy seed layer 107 may be free of one or more layers making up the under bump barrier metallurgy layer 109. For example, portions of the under bump metallurgy seed layer 107 may be free of plated copper and nickel layers making up the under bump barrier metallurgy layer 109. Similarly, portions of the under bump metallurgy seed layer 107 may be free of one or more layers making up the solder bump 111. For example, portions of the under bump metallurgy seed layer 107 may be free of plated tin and silver layers making up the solder bump 111.

Figure 2:
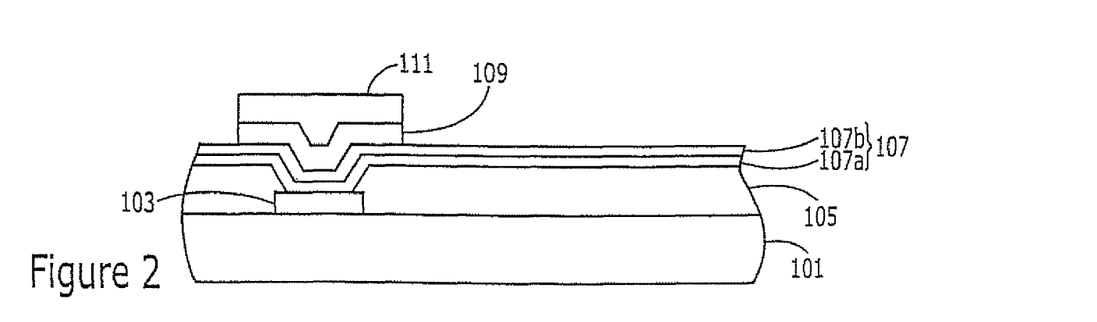
Figure 3:
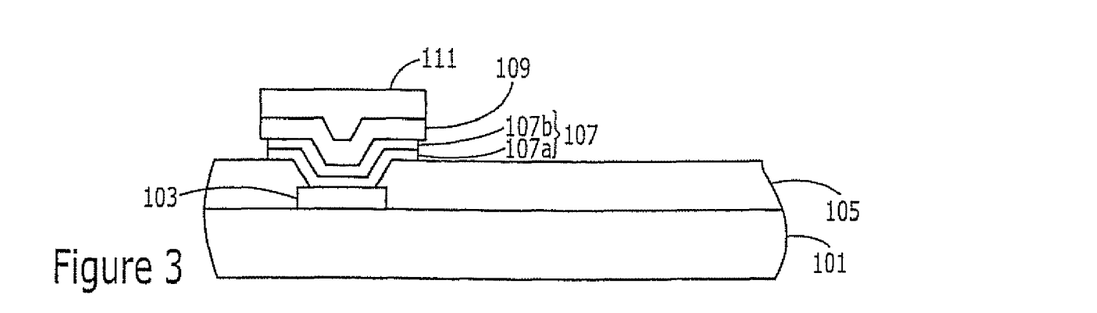

As shown in FIG. 2, the plating stencil 108 may be removed thereby exposing portions of the under bump seed metallurgy layer 107 surrounding the plated layers (i.e. solder bump 111 and/or under bump barrier metallurgy layer 109). As shown in FIG. 3, exposed portions of the under bump seed metallurgy layer 107 may be etched using the under bump barrier metallurgy layer 109 and/or the solder bump 111 as an etch mask. More particularly, a wet etchant may be selected that selectively etches the under bump seed metallurgy layer 107 with respect to the under bump barrier metallurgy layer 109. Accordingly, the under bump seed metallurgy layer 107 may be undercut with respect to the under bump barrier metallurgy layer 109, as shown in FIG. 3. While not shown in FIG. 3, the etchant used to etch the under bump seed metallurgy layer 107 may etch the solder bump 111 (or portions thereof) selectively with respect to the under bump barrier metallurgy layer 109 so that the solder bump 111 of FIG. 3 (or portions thereof) may be set back relative to the under bump barrier metallurgy layer 109. Stated in other words, the under bump barrier metallurgy layer 109 of FIG. 3 may include a lip portion extending laterally beyond the under bump seed metallurgy layer 107 and the solder bump 111 (or portions thereof). In an alternative, the etchant used to remove exposed portions of the under bump seed metallurgy layer 107 may be selective with respect to the solder bump or portions thereof.

Figure 4:
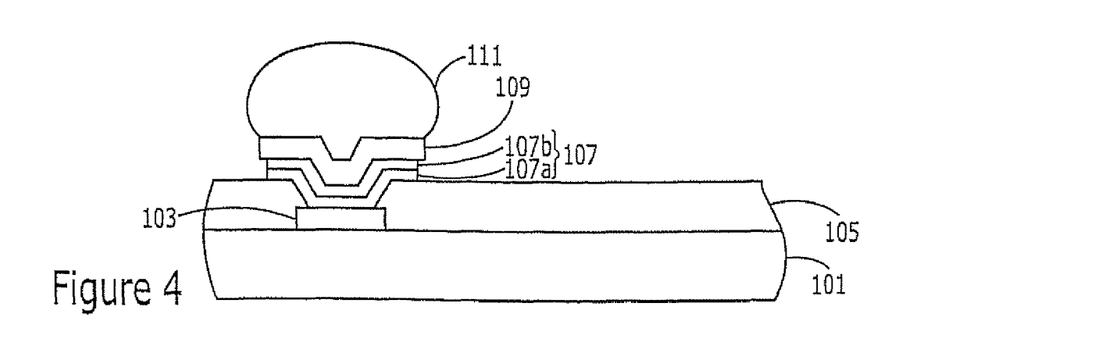

After removing exposed portions of the under bump seed metallurgy layer 107 to provide the structure illustrated in FIG. 3, the solder bump 111 can be subjected to a reflow operation to provide the structure illustrated in FIG. 4. If the solder bump 111 is plated as separate layers of different metals, the reflow operation may serve to at least partially mix the separate layers into a solder alloy. For example, if the solder bump 111 is plated as separate layers of tin and silver, a reflow operation may serve to at least partially mix the tin and silver into a tin-silver solder alloy having an average concentration of silver in the range of about 1 weight percent to about 3 weight percent, and/or having an average concentration of tin in the range of about 97 weight percent to about 99 weight percent. The reflow operation may be performed by heating the solder bump 111 to at least a liquidus temperature of a metal of the solder bump having the highest liquidus temperature. According to particular embodiments, the solder bump may be heated to a temperature not exceeding the liquidus temperature of the metal having the highest liquidus temperature. In other alternatives, a reflow operation may be omitted, solid state diffusion at a temperature below the melting temperature of either metal may be used to at least partially mix metals of different layers, and/or the metals may be heated to a temperature greater than a melting temperature of the alloy and less than a melting temperature of either of the metals.

If different metals of the solder bump 111 are plated simultaneously using a same plating solution, a reflow operation may be performed to provide the rounded shape of FIG. 4, and/or to more evenly distribute metals of the solder alloy. If the solder bump 111 is plated as a mixture of tin and silver, a reflow operation may serve to more evenly distribute the tin and silver in the tin-silver solder alloy so that an average concentration of silver is in the range of about 1 weight percent to about 3 weight percent, and/or an average concentration of tin is in the range of about 97 weight percent to about 99 weight percent. The reflow operation may be performed by heating the solder bump 111 to at least a liquidus temperature of the solder alloy. According to particular embodiments, the solder bump may be heated to a temperature not exceeding the liquidus temperature of the solder alloy. In other alternatives, a reflow operation may be omitted, solid state diffusion at a temperature below the melting temperature of either metal may be used to at least partially mix metals of the solder bump, and/or the metals may be heated to a temperature greater than a melting temperature of the alloy and less than a melting temperature of either of the metals.

In an alternative, a solder reflow operation may be performed before removing exposed portions of the under bump seed metallurgy layer 107 and/or before removing the plating stencil 108. If the solder reflow operation is performed before removing exposed portions of the under bump seed metallurgy layer 107, an additional solder non-wettable layer (such as a layer of chromium) may be provided on portions of the tinder bump seed metallurgy layer 107 surrounding the plated layers (i.e. under bump barrier metallurgy layer 109 and solder bump 111). In addition or in an alternative, an oxide layer may be maintained on the solder to prevent spreading across the under bump seed metallurgy layer during reflow.

Figure 5:
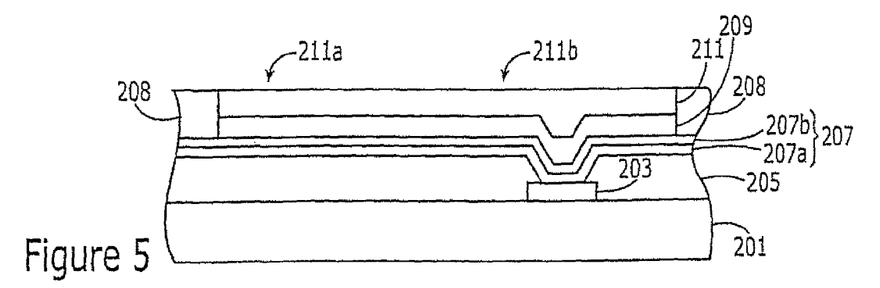
FIGS. 5-8 are cross-sectional views illustrating steps of forming solder bumps according to additional embodiments of the present invention.

According to embodiments of the present invention illustrated in FIGS. 5-8, redistribution of a solder bump from an input/output pad may be provided, and/or an increased solder bump size may be provided. As shown in FIG. 5, an integrated circuit substrate 201 may include a semiconductor substrate having electronic circuits (such as one or more resistors, transistors, diodes, capacitors, inductors, etc.) therein, and a conductive input/output pad 203 (such as an aluminum and/or copper pad) on the substrate 201 may provide electrical connection with one or more circuits of the substrate 201. In addition, an insulating passivation layer 205 may be provided on the substrate 201 and input/output pad 203, and a via hole in the passivation layer 205 may expose at least portions of the input/output pad 203. As used herein, the term substrate may also be defined to include the input/output pad and the passivation layer. The term substrate may also include interconnection wiring therein.

As shown in FIG. 5, an under bump seed metallurgy layer 207 may be deposited on the passivation layer 205 and on exposed portions of the input/output pad 203, and the under bump seed metallurgy layer 207 may include an adhesion layer 207a, such as a layer including titanium (Ti), titanium-tungsten (TiW), titanium nitride (TiN), and/or chromium (Cr), and a conduction layer 207b, such as a layer including copper (Cu), silver (Ag), and/or gold (Au). A plating stencil 208 of an organic and/or an inorganic material can then be formed on the under bump seed metallurgy layer 207. The plating stencil 208, for example, may be formed by spinning or laminating a photosensitive material on the under bump seed metallurgy layer 207, baking the photosensitive material, selectively exposing the photosensitive material to light, and developing the photosensitive material to form the via hole exposing at least portions of the input/output pad 203.

In embodiments illustrated in FIGS. 5-8, the plating stencil may expose an elongate portion of the under bump seed metallurgy layer 207 extending away from the input/output pad 203 having a relatively narrow width and an enlarged width portion of the under bump seed metallurgy layer 207 laterally spaced from the input/output pad 203. In subsequent plating and reflow steps, a relatively wide solder structure may result to provide a relatively thick solder bump laterally spaced apart from the input/output pad 207, and a relatively narrow solder structure may result to provide a relatively thin solder redistribution line between the solder bump and the input/output pad 207. Redistribution routine conductors are discussed, for example, in U.S. Pat. No. 6,392,163 entitled Controlled-Shaped Solder Reservoirs For Increasing The Volume Of Solder Bumps; U.S. Pat. No. 6,389,691 entitled Methods For Forming Integrated Redistribution Routing Conductors And Solder Bumps; U.S. Pat. No. 6,388,203 entitled Controlled-Shaped Solder Reservoirs For Increasing The Volume Of Solder Bumps, And Structures Formed Thereby; U.S. Pat. No. 6,329,608 entitled Key-Shaped Solder Bumps And Under Bump Metallurgy. The disclosures of these patents are hereby incorporated herein in their entirety by reference.

An under bump barrier metallurgy layer 209 may then be plated on portions of the under bump seed metallurgy layer 207 exposed through the plating stencil 208, and the under bump barrier metallurgy layer 209 may include nickel (Ni) and/or copper (Cu). The under bump barrier metallurgy layer 209 may be a layer of nickel having a thickness in the range of about 1 μm (micrometers) to 5 μm (micrometers), and more particularly, in the range of about 1.5 μm (micrometers) to about 5 μm (micrometers). In an alternative, the under bump barrier metallurgy layer 209 may be a layer of copper having a thickness greater than about 5 μm (micrometers). According to some embodiments of the present invention, the under bump barrier metallurgy layer 209 may include a copper layer (for example, having a thickness greater than about 5 μm) and a nickel layer (for example, having a thickness in the range of about 1 μm to about 5 μm) such that the copper layer is between the nickel layer and the under bump seed metallurgy layer 207. Because the under bump barrier metallurgy layer 209 is plated using the plating stencil 208, the under bump barrier metallurgy layer 209 may include an enlarged width portion laterally spaced apart from the input/output pad 203 and a elongate portion between the enlarged width portion and the input/output pad 203. In some embodiments of the present invention, the under bump barrier metallurgy layer 209 may include a nickel layer plated directly on the under bump seed metallurgy layer 207 without an intervening layer of plated copper.

After plating the under bump barrier metallurgy layer 209, a lead free solder structure 211 may be plated on the under bump barrier metallurgy layer 209, and the lead free solder structure 211 may be a binary lead free alloy solder structure such as a tin-silver (SnAg) alloy solder structure, a tin-silver-copper alloy solder structure, and/or a tin-copper alloy solder structure. Moreover, the lead free solder structure 211 may be plated as separate layers of tin and silver (or separate layers of tin, silver, and copper; separate layers of tin and copper; etc.), and a subsequent reflow (and in some embodiments after removing the plating stencil) can be used to form the alloy thereof. In an alternative, the tin and silver may be plated together. In either case, the tin and silver may be provided such that a concentration of silver in the resulting solder alloy is sufficiently low to suppress formation of SnAg platelets, precipitates, and/or needles that may otherwise occur as a result of temperature excursions. For example, a concentration of tin in the resulting solder alloy may be greater than about 95 weight percent. More particularly, a concentration of silver in the resulting solder alloy may be in the range of about 1 weight percent to about 3 weight percent, and/or a concentration of tin in the resulting solder alloy may be in the range of about 97 weight percent to about 99 weight percent. In other alternatives, the lead free solder structure 211 may include tin and at least one of bismuth, copper, indium, antimony, gold, zinc, and/or silver. For example, the lead-free solder structure 211 may include a tin-silver-copper solder. In another alternative, the lead-free solder structure may include a tin-copper solder having a concentration of tin of about 99.5 weight percent.

Because the solder structure 211 is plated using the plating stencil 208, the solder structure 211 may include an enlarged width portion 211a laterally spaced apart from the input/output pad 203 and a elongate portion 211b between the enlarged width portion and the input/output pad 203. As shown, a plated thickness of the solder structure 211 may be relatively uniform. Differences in widths of the solder structure and underlying under bump barrier metallurgy layer 209 may provide differences in internal solder pressures due to surface tension during a subsequent reflow operation so that solder flows from elongate portion 211b to enlarged width portion 211a thereby increasing a size of a resulting solder bump.

More particularly, a first layer of tin can be plated followed by a second layer of silver, or a first layer of silver can be plated followed by a second layer of tin, and thicknesses of the layers of tin and silver can be determined to provide an average concentration of silver in the resulting SnAg solder alloy (after reflow) in the range of about 1 weight percent to about 3 weight percent, and/or to provide an average concentration of tin in the range of about 97 weight percent to about 99 weight percent. The thicker layer of tin may be plated before plating the thinner layer of silver, for example, because the thicker layer of tin may be easier to plate on the under bump barrier metallurgy layer 209 within the hole defined by the plating stencil 208. Stated in other words, the thinner layer of silver may be plated with better uniformity and/or control after plating the thicker tin layer. After plating the layers of the different metals (and in some embodiments after removing the plating stencil and/or after removing portions of the under bump seed metallurgy layer), the layers of tin and silver may be heated to a temperature that is less than a melting temperature of at least one of the metals to provide an alloy of the two metals (e.g., tin and silver). More particularly, the layers of the two metals may be heated to a temperature that is less than a melting temperature of either of the two metals (e.g., less than about 232 degrees C. for tin and less than about 962 degrees C. for silver), but that is greater than a melting temperature of the alloy of the two metals (e.g., greater than about 220 degrees C. for tin-silver). In another alternative, the layers of the two metals may be heated to a temperature that is greater than the melting temperature of one of the metals (e.g., greater than about 232 degrees C. for tin) but less than a melting temperature of the other metal (e.g., less than about 962 degrees C. for silver).

In an alternative, tin and silver can be plated together (simultaneously) to provide a plated alloy having an average concentration of silver in the range of about 1 weight percent to about 3 weight percent, and/or having an average concentration of tin in the range of about 97 weight percent to about 99 weight percent. A composition of the plated alloy may be controlled by adjusting an electroplating current density while plating the tin and silver using a plating solution including both tin and silver.

In another alternative for forming the solder structure 211, a first relatively tin rich layer may be plated, and then a second relatively silver rich layer may be plated using a same plating bath including both tin and silver. More particularly, the first relatively tin rich layer may be plated using the plating bath and using a first plating voltage and/or plating current, and the second relatively silver rich layer may be plated using the same plating bath and a second plating voltage and/or plating current (different than the first plating voltage and/or plating current) so that a concentration of tin in the first relatively tin rich layer is greater than a concentration of tin in the second relatively silver rich layer and so that a concentration of silver in the first relatively tin rich layer is less than a concentration of silver in the second relatively silver rich layer. For example, the first plating voltage and the first plating current may be less than the second plating voltage and the second plating current. At the higher plating voltage and higher plating current, the plating bath may be relatively depleted of tin in the vicinity of plating so that a plating rate of tin is reduced while plating the second relatively silver rich layer. As used herein, silver rich means that the concentration of silver is greater in the second layer than in the first layer, but does not necessarily mean that the concentration of silver in the second layer is greater than the concentration of tin in the second layer. After plating the first relatively tin rich layer and the second relatively silver rich layer (and in some embodiments after removing the plating stencil and/or after removing portions of the under bump seed metallurgy layer), the layers may be heated to provide at least partial mixing of the layers. More particularly, the layers may be heated to a temperature that is less than a melting temperature of at least one of silver and/or tin.

As shown in FIG. 5, portions of the under bump metallurgy seed layer 207 may be free of one or more layers making up the under bump barrier metallurgy layer 209. For example, portions of the under bump metallurgy seed layer 207 may be free of plated copper and nickel layers making up the under bump barrier metallurgy layer 209. Similarly, portions of the under bump metallurgy seed layer 207 may be free of one or more layers making up the solder structure 211. For example, portions of the under bump metallurgy seed layer 207 may be free of plated tin and silver layers making up the solder structure 211.

Figure 6:
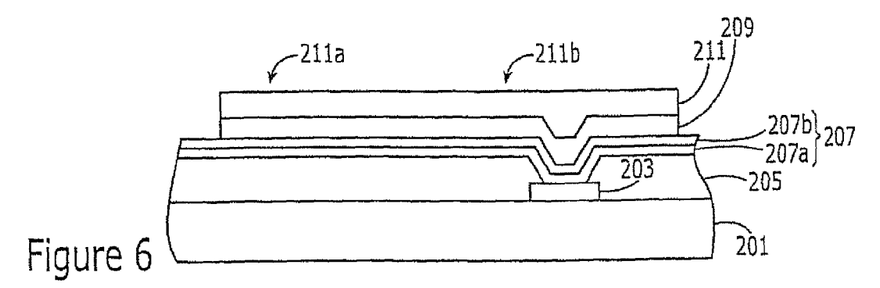
Figure 7:
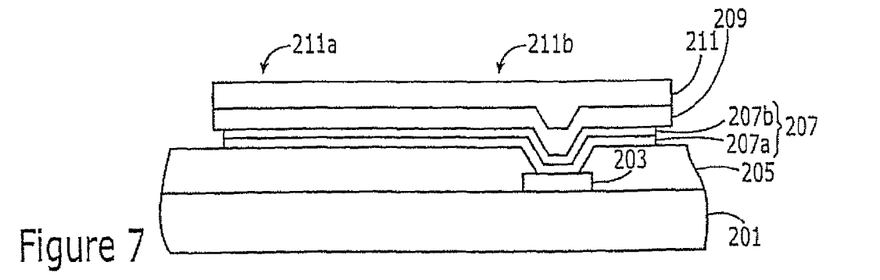

As shown in FIG. 6, the plating stencil 208 may be removed thereby exposing portions of the under bump seed metallurgy layer 207 surrounding the plated layers (i.e. solder structure 211 and/or under bump barrier metallurgy layer 209). As shown in FIG. 7, exposed portions of the under bump seed metallurgy layer 207 may be etched using the tinder bump barrier metallurgy layer 209 and/or the solder structure 211 as an etch mask. More particularly, a wet etchant may be selected that selectively etches the under bump seed metallurgy layer 207 with respect to the under bump barrier metallurgy layer 209. Accordingly, the under bump seed metallurgy layer 207 may be undercut with respect to the under bump barrier metallurgy layer 209, as shown in FIG. 7. While not shown in FIG. 7, the etchant used to etch the under bump seed metallurgy layer 207 may etch the solder structure 211 (or portions thereof) selectively with respect to the under bump barrier metallurgy layer 209 so that the solder structure 211 of FIG. 7 (or portions thereof) may be set back relative to the under bump barrier metallurgy layer 209. Stated in other words, the under bump barrier metallurgy layer 209 of FIG. 7 may include a lip portion extending laterally beyond the under bump seed metallurgy layer 207 and the solder structure 211 (or portions thereof). In an alternative, the etchant used to remove exposed portions of the under bump seed metallurgy layer 207 may be selective with respect to the solder structure or portions thereof.

Figure 8:
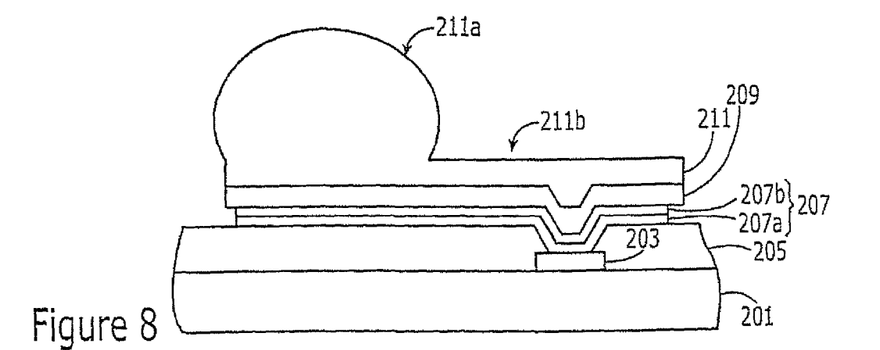

After removing exposed portions of the under bump seed metallurgy layer 207 to provide the structure illustrated in FIG. 7, the solder structure 211 can be subjected to a reflow operation to provide the structure illustrated in FIG. 8. By providing elongate and enlarged width portions of the solder structure 211 and the under bump barrier metallurgy layer 209, differences in internal pressures of the solder due to surface tension may result in a flow of solder from the elongate portion 211$b$ of the solder structure 211 to the enlarged width portion 211$a$ of the solder structure 211 so that a thickness and a volume of the resulting solder bump can be increased. Moreover, a thickness of the elongate portion 211$b$ of the solder structure 211 can be reduced over a conductive redistribution structure.

If the solder structure 211 is plated as separate layers of different metals, the reflow operation may serve to at least partially mix the separate layers into a solder alloy. For example, if the solder structure 211 is plated as separate layers of tin and silver, a reflow operation may serve to at least partially mix the tin and silver into a tin-silver solder alloy having an average concentration of silver in the range of about 1 weight percent to about 3 weight percent, and/or having an average concentration of tin in the range of about 97 weight percent to about 99 weight percent. The reflow operation may be performed by heating the solder structure 211 to at least a liquidus temperature of a metal of the solder bump having the highest liquidus temperature. According to particular embodiments, the solder bump may be heated to a temperature not exceeding the liquidus temperature of the metal having the highest liquidus temperature. In other alternatives, a reflow operation may be omitted, solid state diffusion at a temperature below the melting temperature of either metal may be used to at least partially mix metals of different layers, and/or the metals may be heated to a temperature greater than a melting temperature of the alloy and less than a melting temperature of either of the metals.

If different metals of the solder structure 211 are plated simultaneously using a same plating solution, a reflow operation may be performed to provide the relatively thick raised solder bump 211$a$ and the relatively thin redistribution solder layer 211$b$ of FIG. 8, and/or to more evenly distribute metals of the solder alloy. If the solder structure 211 is plated as a mixture of tin and silver, a reflow operation may serve to more evenly distribute the tin and silver in the tin-silver solder alloy so that an average concentration of silver is in the range of about 1 weight percent to about 3 weight percent, and/or an average concentration of tin is in the range of about 97 weight percent to about 99 weight percent. The reflow operation may be performed by heating the solder structure 211 to at least a liquidus temperature of the solder alloy. According to particular embodiments, the solder bump may be heated to a temperature not exceeding the liquidus temperature of the solder alloy. In other alternatives, a reflow operation may be omitted, solid state diffusion at a temperature below the melting temperature of either metal may be used to at least partially mix metals of the solder bump, and/or the metals may be heated to a temperature greater than a melting temperature of the alloy and less than a melting temperature of either of the metals.

In an alternative, a solder reflow operation may be performed before removing exposed portions of the under bump seed metallurgy layer 207. If the solder reflow operation is performed before removing exposed portions of the under bump seed metallurgy layer 207, an additional solder non-wettable layer (such as a layer of chromium) may be provided on portions of the under bump seed metallurgy layer 207 surrounding the plated layers (i.e. under bump barrier metallurgy layer 209 and solder structure 211). In addition or in an alternative, an oxide layer may be maintained on the solder to prevent spreading across the under bump seed metallurgy layer during reflow.

While particular binary solders (such as tin-silver solder) are discussed herein by way of example, embodiments of the present invention may be provided using other types of solders. Other types of solders, such as ternary solders, may be used according to some embodiments of the present invention. For example, a ternary solder (such as a tin-silver-copper solder) may be used according to some embodiments of the present invention. Moreover, other binary solders such as tin-copper solders may be used with a concentration of tin in the tin-copper solder of about 99.5 weight percent.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. An electronic device comprising:
   an electronic substrate;
   an under bump seed metallurgy layer on the electronic substrate;
   a barrier layer on the under bump seed metallurgy layer so that the under bump seed metallurgy layer is between the barrier layer and the electronic substrate, wherein the barrier layer comprises nickel and/or copper, and wherein portions of the under bump seed metallurgy layer are undercut relative to portions of the barrier layer; and
   a solder layer on the barrier layer so that the barrier layer is between the solder layer and the under bump seed metallurgy layer;
   wherein the barrier layer comprises a nickel layer and a copper layer, and wherein the copper layer is between the under bump seed metallurgy layer and the nickel layer.

2. An electronic device according to claim 1 wherein the barrier layer comprises a nickel layer having a thickness in the range of about 1 µm (micrometer) to about 5 µm (micrometer).

3. An electronic device according to claim 2 wherein the barrier layer has a thickness in the range of about 1.5 µm (micrometer) to about 5 µm (micrometer).

4. An electronic device according to claim 1 wherein the copper layer has a thickness greater than about 5 µm (micrometer).

5. An electronic device according to claim 4 wherein the nickel layer has a thickness in the range of about 1.5 µm (micrometer) to about 5 µm (micrometer).

6. An electronic device according to claim 1 wherein the solder layer comprises a lead-free solder.

7. An electronic device according to claim 1 wherein the solder layer comprises tin and at least one of silver, bismuth, copper, indium, antimony, gold, and/or zinc.

8. An electronic device according to claim 7 wherein a weight percent of tin in the solder layer is greater than about 95 weight percent.

9. An electronic device according to claim 1 wherein the solder layer comprises a first layer of tin and a second layer of silver, bismuth, copper, indium, antimony, gold, and/or zinc.

10. An electronic device according to claim 9 wherein the first layer is between the second layer and the barrier layer.

11. An electronic device according to claim 9 wherein the first layer of tin is greater than about 95 weight percent of the solder layer.

12. An electronic device according to claim 1 wherein the under bump seed metallurgy layer comprises an adhesion layer and a conduction layer and wherein the adhesion and conduction layers comprise different materials.

13. An electronic device according to claim 12 wherein the adhesion layer comprises titanium, titanium-tungsten, titanium nitride, and/or chromium, and wherein the conduction layer comprises copper, silver, and/or gold.

14. An electronic device according to claim 1 wherein the barrier layer comprises a copper layer, and wherein the copper layer has a thickness greater than about 5 µm (micrometer).

15. An electronic device comprising:
    an electronic substrate;
    an under bump seed metallurgy layer on the electronic substrate;
    a barrier layer on the under bump seed metallurgy layer so that the under bump seed metallurgy layer is between the barrier layer and the electronic substrate, wherein the barrier layer comprises nickel and/or copper, and wherein the barrier layer defines a lip portion that extends laterally beyond portions of the under bump seed metallurgy layer wherein the barrier layer comprises a nickel layer and a copper layer, and wherein the copper layer is between the under bump seed metallurgy layer and the nickel layer; and
    a solder layer on the barrier layer so that the barrier layer is between the solder layer and the under bump seed metallurgy layer.

16. An electronic device according to claim 15 wherein the barrier layer comprises a nickel layer having a thickness in the range of about 1 µm (micrometer) to about 5 µm (micrometer).

17. An electronic device according to claim 15 wherein the copper layer has a thickness greater than about 5 µm (micrometer).

18. An electronic device according to claim 17 wherein the nickel layer has a thickness in the range of about 1.5 µm (micrometer) to about 5 µm (micrometer).

* * * * *

UNITED STATES PATENT AND TRADEMARK OFFICE
CERTIFICATE OF CORRECTION

| | |
|---|---|
| PATENT NO. | : 7,839,000 B2 |
| APPLICATION NO. | : 12/437632 |
| DATED | : November 23, 2010 |
| INVENTOR(S) | : Mis et al. |

It is certified that error appears in the above-identified patent and that said Letters Patent is hereby corrected as shown below:

On the Cover:
Item (56) References Cited, Page 2, U.S. Patent Documents:
  Please add -- 3,586,255   6/1971   Monthulet --
Page 3, U.S. Patent Documents:
  Please correct "6,013,572   A   1/2000   Hur"
  to read -- 6,013,572   A   1/2000   Hur et al. --

Signed and Sealed this
Fourth Day of September, 2012

David J. Kappos
*Director of the United States Patent and Trademark Office*